(12) United States Patent
Bakker

(10) Patent No.: US 7,903,258 B2
(45) Date of Patent: Mar. 8, 2011

(54) SYSTEM AND METHOD FOR POSITIONING A PRODUCT USING A LASER INTERFEROMETER

(75) Inventor: Arjan Franklin Bakker, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 328 days.

(21) Appl. No.: 10/597,708

(22) PCT Filed: Jan. 25, 2005

(86) PCT No.: PCT/IB2005/050288
§ 371 (c)(1),
(2), (4) Date: Aug. 4, 2006

(87) PCT Pub. No.: WO2005/078526
PCT Pub. Date: Aug. 25, 2005

(65) Prior Publication Data
US 2008/0144008 A1    Jun. 19, 2008

(30) Foreign Application Priority Data
Feb. 11, 2004 (EP) .................................. 04100515

(51) Int. Cl.
*G01B 11/02* (2006.01)

(52) U.S. Cl. ........................................................ 356/500
(58) Field of Classification Search .................. 356/486, 356/487, 493, 498, 500
See application file for complete search history.

(56) References Cited

U.S. PATENT DOCUMENTS

| | | | | |
|---|---|---|---|---|
| 3,434,787 A * | 3/1969 | Chitayat | ........................ | 356/493 |
| 3,556,660 A * | 1/1971 | Mottier | ........................ | 356/498 |
| 5,363,196 A * | 11/1994 | Cameron | ........................ | 356/500 |
| 5,757,160 A | 5/1998 | Kreuzer | | |
| 6,211,965 B1 * | 4/2001 | Tsuchiya et al. | ............... | 356/493 |
| 6,570,641 B2 * | 5/2003 | Hamada et al. | ................... | 355/53 |
| 6,650,419 B2 * | 11/2003 | Hill | ............... | 356/500 |
| 6,700,665 B2 | 3/2004 | Hill | | |
| 2002/0109823 A1 * | 8/2002 | Binnard et al. | .................. | 355/53 |

* cited by examiner

*Primary Examiner* — Patrick J Connolly
(74) *Attorney, Agent, or Firm* — Larry Liberchuk

(57) ABSTRACT

A system for positioning a product, comprising a chuck for supporting the product, an intermediate stage supporting said chuck, and a stationary base supporting said intermediate stage. The chuck can move with respect to the intermediate stage in a first direction X, and the intermediate stage can move with respect to said stationary base in a second direction Y. The system furthermore comprises at least one laser interferometer for measuring the position of the chuck relative to the stationary base. The main part of the laser interferometer is attached to the intermediate stage, so that it can measure the distance between a reflector on the chuck and a reflector on the stationary base.

9 Claims, 4 Drawing Sheets

SYSTEM AND METHOD FOR POSITIONING A PRODUCT USING A LASER INTERFEROMETER

The invention is related to a system for positioning a product, comprising a chuck for supporting the product, an intermediate stage supporting said chuck, and a stationary base supporting said intermediate stage, whereby the chuck can move with respect to the intermediate stage in a first direction X, and the intermediate stage can move with respect to said stationary base in a second direction Y, furthermore comprising at least one laser interferometer for measuring the position of the chuck relative to the stationary base.

U.S. Pat. No. 5,757,160 discloses such system for accurately positioning and aligning a wafer as used in photolithography or microlithography in semiconductor manufacturing. The system comprises a plurality of interferometer laser gauges, each being the main part of a laser interferometer, attached to the chuck (movable wafer stage) and at least one elongated plane mirror reflector attached to the stationary base. In order to determine the position of the chuck, the distance between said laser gauge and the stationary reflector is measured by means of the laser interferometer.

A laser interferometer, as referred to in this description, is generally known and comprises a main part, or laser gauge, which main part directs a laser beam towards one or more retro-reflectors. The retro-reflector reflects the laser beam back to said main part, and the main part receives the reflected laser beam. The length of the path of the laser beam is determined by the laser interferometer, and therefore the distance between said main part and said retro-reflector can be measured. Said main part of the laser interferometer may comprise known components such as a polarizing beam splitter, a quarter wave plate, and a cube corner reflector.

A polarizing beam splitter divides a laser beam, having two or more polarization directions, into two polarized laser beams, each having a certain polarizing direction. Thereby a first laser beam is passing the splitter in a straight path, and the other beam is directed in a certain direction, in particular under an angle of 90° with respect to the original beam.

A quarter wave plate rotates the direction of the polarization of a polarized laser beam over 45°, when such polarized laser beam is passing through such quarter wave plate.

A cube corner reflector is a retro-reflector provided with three plane mirrors under an angle of 90° to each other, like in the corner of a cube. A laser beam is reflected by a cube corner reflector in a direction parallel to the incident laser beam, however, in reverse direction and at a certain distance relative to said incident laser beam.

In the known system for positioning a product, as is disclosed in U.S. Pat. No. 5,757,160, the distance between certain locations on the chuck and corresponding locations on the stationary base is measured, so that a quite exact determination of the position of the chuck is possible. However, in the known system the main part of each laser interferometer is attached to the chuck, and therefore such configuration requires a rather large and heavy chuck, whereby furthermore electrical wires has to be present between the chuck and the stationary base. As an alternative, the main part of each laser interferometer can be attached to the stationary base. However, in that case the chuck has to be provided with a relatively large elongated plane mirror reflector. That reflector must be longer than the range of travel of the chuck, to make sure that the laser beam is caught by the reflector in each position of the chuck.

The object of the invention is to provide a system for positioning a product by means of laser interferometers, whereby the chuck is provided with relatively small parts of the laser interferometers, and whereby laser interferometers measure the distance between certain locations on the chuck and corresponding locations on the stationary base.

In order to accomplish that objective, the main part of the laser interferometer is attached to the intermediate stage, so that it can measure the distance between a reflector on the chuck and a reflector on the stationary base. A laser interferometer for measuring the distance between two reflectors at both sides of the main part of the interferometer is known. In case the main part of such laser interferometer is attached to the intermediate stage, whereby the measuring laser beam is parallel with said first direction X, that laser beam will always hit the same location on the chuck, and therefore that location of the chuck can be provided with a relatively small retro-reflector.

Preferably, said reflector on the stationary base is an elongated plane mirror reflector, having a length larger than the maximal displacement of the intermediate stage in said second direction Y, so that the laser beam from the interferometer will hit that reflector in each position of the intermediate stage. In case such large plane mirror reflector is used, it is an advantage that such large reflector is attached to the stationary base, and not to any moving part of the system.

In one preferred embodiment, the main parts of two laser interferometers are attached to said intermediate stage, each for measuring the distance between a respective reflector on the chuck and the same elongated plane mirror reflector on the stationary base. Thereby the measurement takes place in the first direction X at one side of the chuck, so that the position of the chuck in the first direction X is measured as well its angular position relative to an axis in the third direction Z, perpendicular to the first direction X and the second direction Y. Of course, apart from said two laser interferometers, also the main parts of other laser interferometers may be attached to the intermediate stage.

Preferable, the main parts of three laser interferometers are attached to said intermediate stage, for measuring distances in the first direction X between one or more reflectors on the chuck and one or more plane mirror reflectors in the stationary base. One large plane mirror reflector can be attached to the stationary base and/or to the chuck. However, the chuck is preferably provided with three cube corner reflectors, because such retro-reflectors are not sensitive for angular variations of their positions. When the measurement takes place at three locations that do not lie in a flat plane, the angular position of the chuck in the XY plane (i.e. around an axis in the third direction Z) as well as in the XZ plane (i.e. around an axis in the second direction Y) can be determined.

Preferably, said reflector on the chuck is a cube corner reflector, whereby more cube corner reflectors may be attached to the chuck. The advantage of the cube corner reflector is its insensibility to small angular variations, so that the laser beam is always reflected parallel to the incident laser beam, independent of angular variations of the position of the chuck.

In one preferred embodiment, the main part of a laser interferometer is attached to said intermediate stage for measuring the distance in the third direction Z between a reflector on the chuck and a reflector on the stationary base, which direction Z is perpendicular to the first direction X and the second direction Y. Thereby the stationary base is provided with a plane mirror reflector extending in a plane parallel to the first direction X and the second direction Y, which plane mirror reflector is elongated in the second direction Y. The chuck is provided with a plane mirror reflector also extending in a plane parallel to the first direction X and the second direction Y, which reflector is elongated in the first direction X. The elongated reflector is attached to the lower side of the chuck, which is not the side where the product to be positioned is located, and therefore there is no need to enlarge the chuck in order to attach that plane mirror reflector.

A system for measuring a distance by means of a laser interferometer, whereby the interferometer measures the distance between a plane mirror reflector and a cube corner reflector, or between two cube corner reflectors, can also be applied for other measurements, whereby the distance between two objects has to be measured and whereby the angular position one of the objects, or of both objects, may vary. Therefore this measurement system can be seen as a separate invention, which invention can be applied independent of the application of other inventions described in this description.

Such separate invention can be described as a system for measuring the distance between two objects by means of a laser interferometer, whereby a part of the laser interferometer, comprising a laser beam splitter, a cube corner reflector and two quarter wave plates, is located between the two objects, whereby a retro-reflector is attached to each of the objects, whereby one of the objects is provided with a plane mirror reflector and whereby the other object is provided with a cube corner reflector, or whereby both objects are provided with a cube corner mirror reflector.

The invention is furthermore related to a method for positioning a product by means of a system comprising a chuck for supporting the product, an intermediate stage supporting said chuck, and a stationary base supporting said intermediate stage, whereby the chuck can move with respect to the intermediate stage in a first direction X, and the intermediate stage can move with respect to said stationary base in a second direction Y, furthermore comprising at least one laser interferometer for measuring the position of the chuck relative to the stationary base, whereby the distance between a reflector on the chuck and a reflector on the stationary base is measured by means of a laser interferometer, whereby the main part of that laser interferometer is attached to said intermediate stage.

In order to elucidate the invention, embodiments and portions of a system for positioning a product by means of laser interferometers will be described referring to the drawing, in which FIG. 1 shows a laser interferometer for measuring a distance;

The figures are very schematic representations, whereby only relevant portions of the system for positioning a product by means of laser interferometers are shown.

Figure 1:
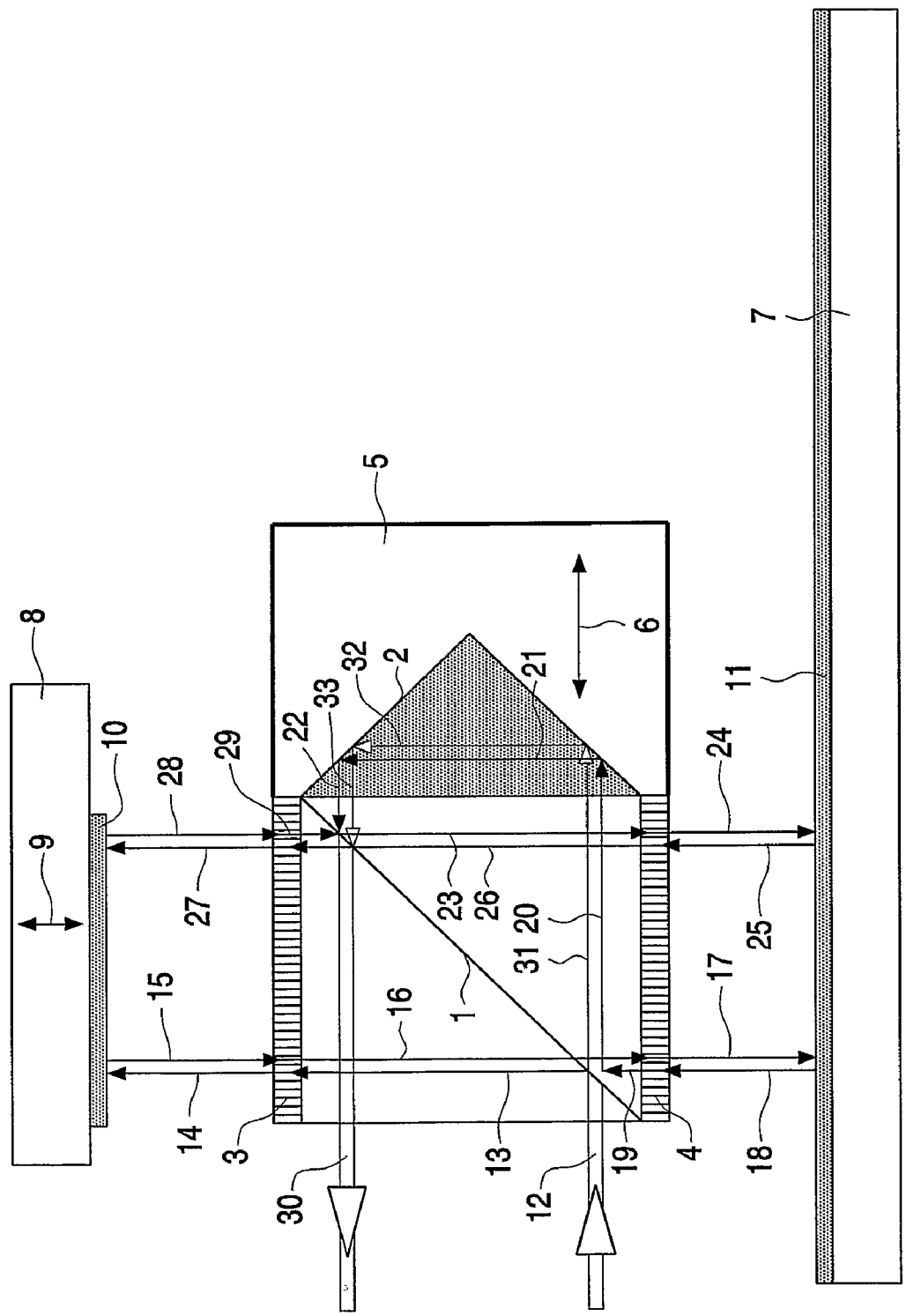

FIG. 1 shows a laser interferometer comprising a laser beam splitter 1, a cube corner reflector 2 and two quarter wave plates 3,4, also called λ/4 plates. These components of the laser interferometer are attached to the intermediate stage 5 of a system for positioning of a product. The intermediate stage 5 can move in a second direction Y, as is indicated with arrow 6. The laser interferometer is located between a stationary base 7 and a chuck 8, to which the product to be positioned can be attached. The chuck 8 can move in a first direction X with respect to the intermediate stage 5, as is indicated with arrow 9. A plane mirror reflector 10 is attached to the chuck 8 and an elongated plane mirror reflector 11 is attached to the stationary base 7.

The distance between the stationary base 7 and the chuck 8 can be measured by means of the laser interferometer as follows. A polarized laser beam 12, comprising two polarization directions perpendicular to each other is directed to the represented parts of the interferometer. A first part of the laser beam 12 follows a path including four times the distance between the plane mirror reflectors 10,11, and the other part of the laser beam 12 follows a fixed path through the laser interferometer. The distance between the two plane mirror reflectors 10,11, and therewith the distance between the chuck 8 and the stationary base 7, can be determined based on the difference in lengths of said two paths followed by the two parts of the laser beam. The interferometer can measure that difference in length.

In the beam splitter 1, the first part of the incident laser beam 12 is turned off by an angle of 90° (arrow 13) to and through quarter wave plate 3 towards the plane mirror reflector 10 (arrow 14). The reflected laser beam (arrow 15) passes again the quarter wave plate 3, so that the direction of the polarization of the laser beam (arrow 16) is rotated over 90° (two times 45°) compared to the laser beam indicated with arrow 13. Therefore, the laser beam (arrow 16) can pass the beam splitter 1 in a straight path towards quarter wave plate 4, where the direction of polarization rotates over 45°. Then the laser beam (arrow 17) is reflected against the plane mirror reflector 11 and returns at the quarter wave plate 4 (arrow 18), where the direction of polarization rotates again over 45°, so that the beam (arrow 19) is rotated over 90° compared to the beam indicated with arrow 16. Therefore, the beam (arrow 19) is turned off by an angle of 90° by the laser beam splitter 1 (arrow 20) towards cube corner reflector 2.

In the cube corner reflector 2 the beam 20 is reflected (arrow 21) in order to leave the reflector 2 (arrow 22) in reverse direction parallel to and at a distance from the incident beam 20. The reflected beam 22 is turned off by an angle of 90° (arrow 23) by the beam splitter 1 towards quarter wave plate 4. When passing quarter wave plate 4 the direction of the polarization of the laser beam is rotated over 45° and after reflection against plane mirror reflector 11 (arrows 24 and 25) the direction of polarization is again rotated over 45° by the quarter wave plate 4, so that the laser beam (arrow 26) can pass the beam splitter 1 in a straight path towards quarter wave plate 3. The direction of polarization of the beam is rotated over 45° and the beam (arrow 27) is directed towards plane mirror reflector 10. After reflection by the plane mirror reflector 10 the laser beam (arrow 28) arrives again at the quarter wave plate 3, where the direction of polarization is again rotated over 45°, so that the total rotation compared to the beam indicated by arrow 26 is 90°. Therefore, the beam (arrow 29) is turned off by an angle of 90° by the beam splitter 1, whereby the beam is combined again with said other part of the original laser beam 12 to form the laser beam 30 that leaves the relevant part of the interferometer.

The other part of the laser beam 12 has a direction of polarization that can pass the laser beam splitter 1 in a straight path (arrow 31), and after reflection by cube corner 2 (arrow 32) the other part of the laser beam is directed towards the beam splitter 1 (arrow 33). The laser beam (arrow 33) passes again the beam splitter 1 in a straight path, so that it forms a part of the laser beam 30 that leaves the relevant part of the laser interferometer.

The part of the laser interferometer that measures the difference in length of the two paths that is followed by the two parts of the laser beam is not represented in the figure. That part of the interferometer is located at a fixed position relative to the stationary base 7, so that the distance between that part and the main part of the interferometer that is attached to the intermediate stage 5 varies. However, such variation does not have influence on the difference in length of said two paths, and therefore it has no influence on the measurement results.

Figure 2:
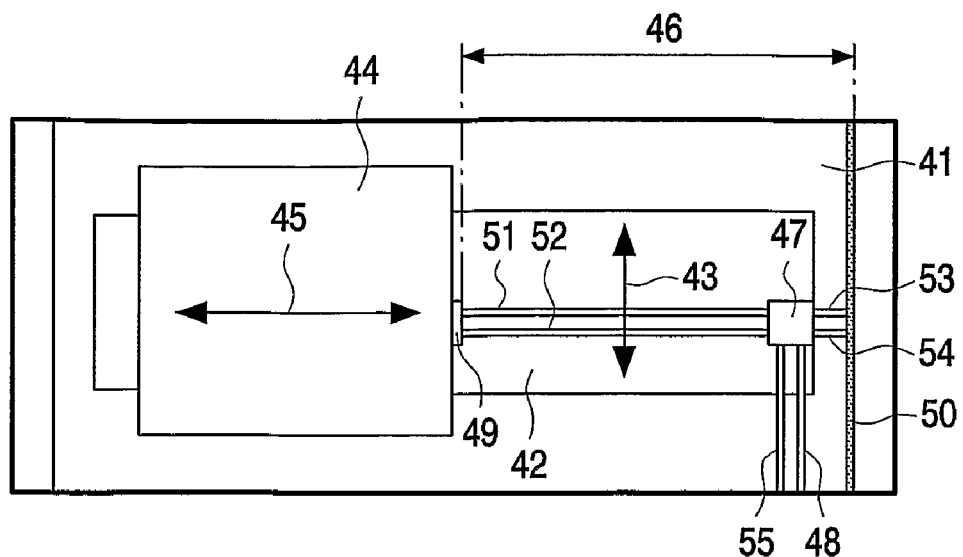
FIG. 2 is a top view of a first example of an interferometer measurement.

FIG. 2 is a top view of a positioning system showing a stationary base 41 supporting an intermediate stage 42 that can move in the second direction Y (arrow 43) relative to the stationary base 41. The intermediate stage 42 supports the chuck 44, which chuck 44 can support the product to be positioned. The chuck 44 can move relative to the intermediate stage 42 in the first direction X (arrow 45). FIG. 2 shows the main parts of a laser interferometer for measuring the position of the chuck 44 in de first direction X with respect to the stationary base 41. Therefore the distance 46 is measured by means of a laser interferometer as is described above referring to FIG. 1.

The main part 47 of the interferometer comprises a beam splitter, a cube corner reflector and two quarter wave plates, and is attached to the intermediate stage 42. A laser beam 48, being parallel to the second direction Y, is directed to said main part 47. As described above, a first part of the laser beam 48 follows a path including four times the distance between said main part 47 and a plane mirror reflector 49 on the chuck and four times the distance between said main part 47 and an elongated plane mirror reflector 50 on the stationary base 41. Each of the four beams 51,52,53,54 represents a forward and a return path of said first part of the laser beam 48 towards the plane mirror reflectors 49 and 50 respectively.

The other part of the laser beam 48 follows a much shorter path having a fixed length, as is described above referring to FIG. 1. The two parts of the laser beam 48 are combined again in the laser beam 55 that leaves said main part 47 of the interferometer. The difference in lengths of said two paths is determined by the interferometer, and thereby the distance 46 is measured.

Figure 3:
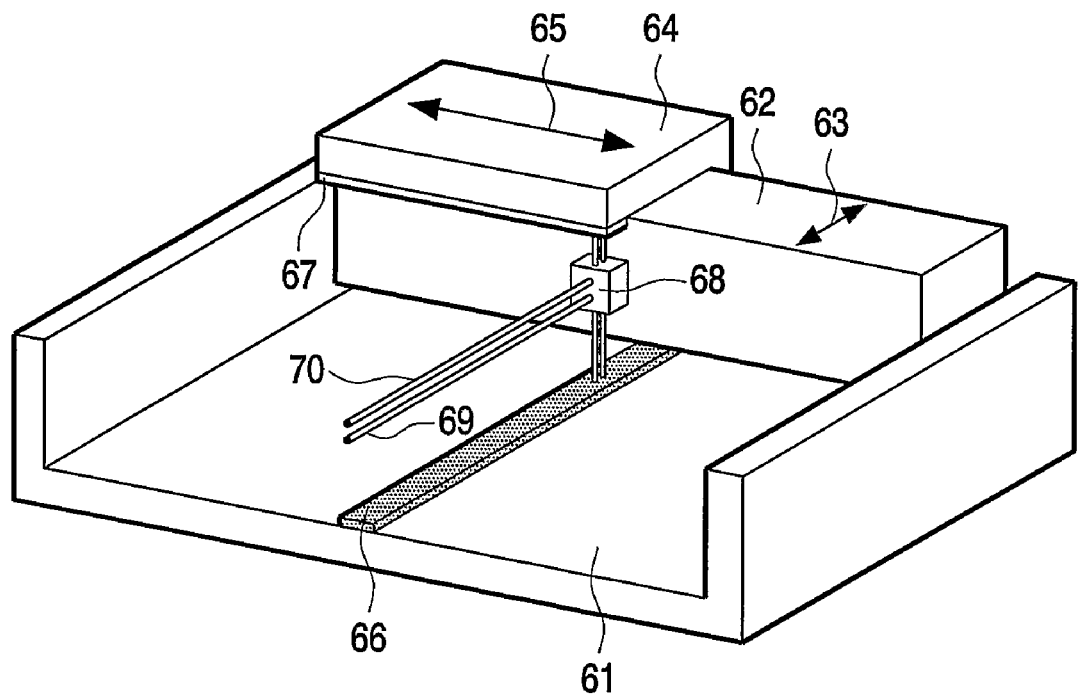
FIG. 3 is a perspective view of a second example of an interferometer measurement.

FIG. 3 shows an example whereby the position of the chuck relative to the stationary base in the third direction Z is measured by means of a laser interferometer. The stationary base 61 supports the intermediate stage 62, which intermediate stage can move in the second direction Y (arrow 63). The intermediate stage 62 supports the chuck 64, which chuck 64 can move in the first direction X (arrow 65) relative to the intermediate stage 62. The product to be positioned can be attached to the chuck 64.

The stationary base 61 is provided with an elongated plane mirror reflector 66 extending in the second direction Y, and the lower side of the chuck 64 is provided with an elongated plane mirror reflector 67 extending the first direction X. Both plane mirror reflectors 66,67 are parallel to the first direction X and to the second direction Y. In order to measure the positioning of the chuck 64 relative to the stationary base 61, the main part 68 of the interferometer directs laser beams towards the two plane mirror reflectors 66,67. Thereby the interferometer functions in the same way as described above referring to FIG. 2. A laser beam 69 is directed to said main part 68 and a laser beam 70 returns from it. A part of the laser beam 69,70 follows a path including the distance between the two plane mirror reflectors 66,67, and the other part of the laser beam 69,70 follows a path having a fixed length. The interferometer can determine the difference in length of the two paths and therewith the distance between the two plane mirror reflectors 66,67 is measured.

Figure 4:
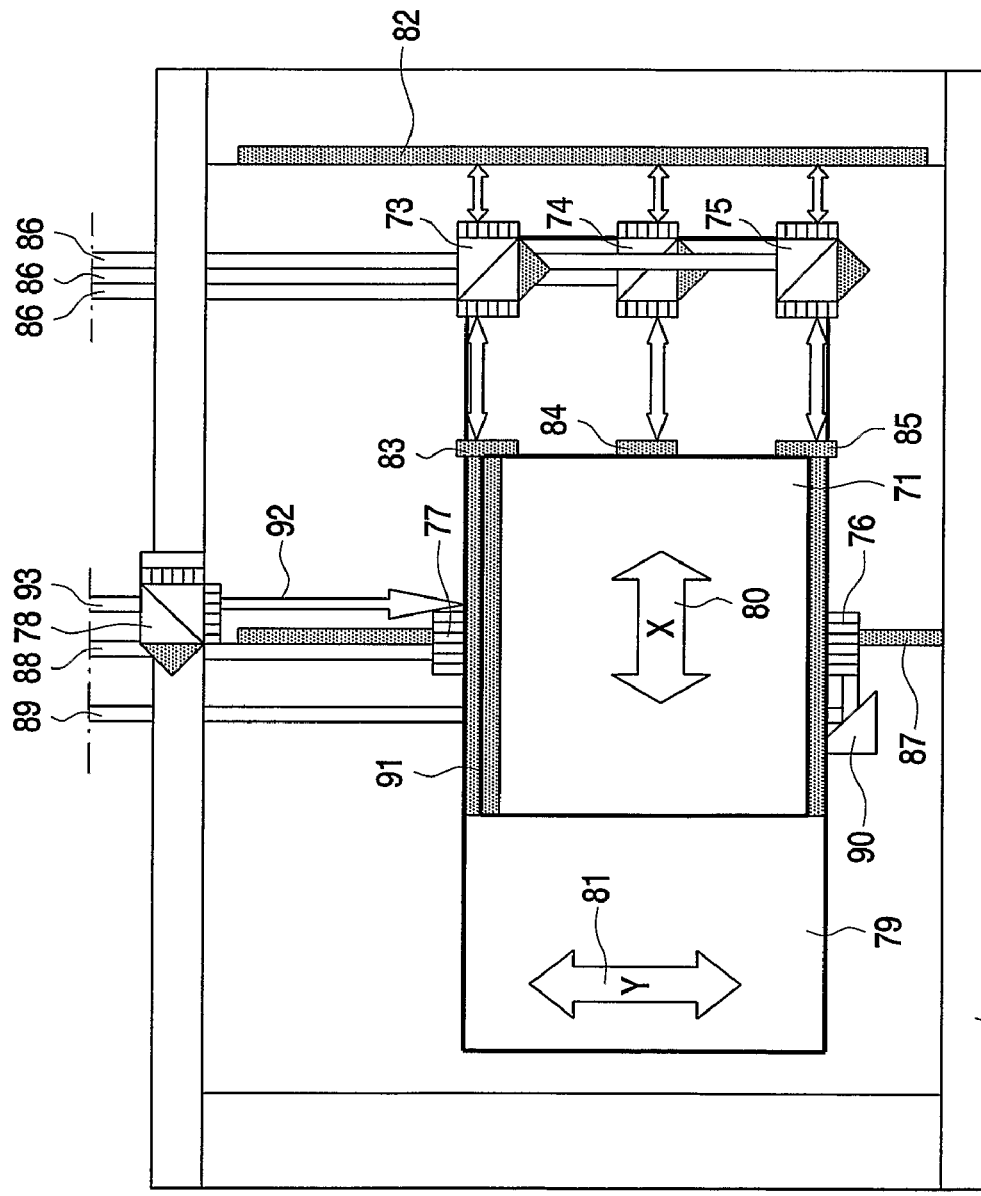
FIG. 4 is a top view of a third example of an interferometer measurement.

FIG. 4 shows in top view a system for positioning a product by means of a number of laser interferometers. Thereby the chuck 71 is substantially surrounded by the stationary base 72, and the position of the chuck 71 relative to the stationary base 72 is measured by six laser interferometers 73,74,75,76, 77,78, so that the complete position of the chuck 71 (i.e. the location and the rotational position) can be determined.

The chuck 71 is supported by intermediate stage 79 and can move in the first direction X relative to intermediate stage 79, as is indicated with arrow 80. The intermediate stage 79 is supported by the stationary base 72 and can move in the second direction Y relative to the stationary base 72, as is indicated with arrow 81. The product to be positioned can be attached to the chuck 71 and the chuck 71 can be displaced, whereby the each position of the chuck can be determined by measurements by means of each of the six laser interferometers 73,74,75,76,77,78.

The three laser interferometers 73,74,75 are attached to the intermediate stage 79 and can measure the distance between the elongated plane mirror reflector 82 attached to the stationary base 72 and three respective plane mirror reflectors 83,84, 85 on the chuck 71. The three interferometers 73,74,75 are of the type described above and shown in FIG. 1. Each laser beam, comprising the beams towards and from each of the three interferometers, is indicated with reference numeral 86. The measurements of the three interferometers 73,74,75 are similar to the measurement as described above referring to FIG. 2. The interferometer 74 is located lower than the other two interferometers 73,75, so that the three plane mirror reflectors 83,84,85 are located at the corners of a triangle, whereby reflector 84 is located lower than the other two reflectors 83,85. Therefore the three interferometers 73,74,75 can measure the position of the chuck 71 in the first direction X and the angular positions around an axis in the second direction Y and around an axis in the third direction Z.

The two laser interferometers 76,77 are also attached to the intermediate stage 79 and can measure the distance between elongated plane mirror reflector 87 attached to the stationary base 72 and two elongated plane mirror reflectors extending in the first direction X (not shown in the figure) at the lower side of the chuck 71. Both interferometers 76,77 are of the type described above and shown in FIG. 1. The measurements of the two interferometers 76,77 are similar to the measurement as described above referring to FIG. 3. The laser beam 88 comprises the laser beams towards and from interferometer 77, and the laser beam 89 comprises the laser beams towards and from interferometer 76, which beam is reflected by mirror 90 on its way to and from the interferometer 76. The two interferometers 76,77 can measure the position of the chuck 71 in the third direction Z and the angular position around an axis in the first direction X.

Laser interferometer 78 is attached to the stationary base 72 and can measure its distance to the elongated plane mirror reflector 91 on the chuck 71. Interferometer 78 is of an conventional type. Arrow 92 indicates the path of the measuring laser beam and the length of that path is measured. Beam 93 shows the laser beam towards and from the interferometer 78.

In the above description the expression interferometer is used for the main part of that device, i.e. the part that directs the measuring laser beam towards the retro-reflectors. The part of each interferometer that measures the difference in length of the path of the measuring laser beam and the fixed length of the path of the reference laser beam is not represented in the drawing.

Figure 5:
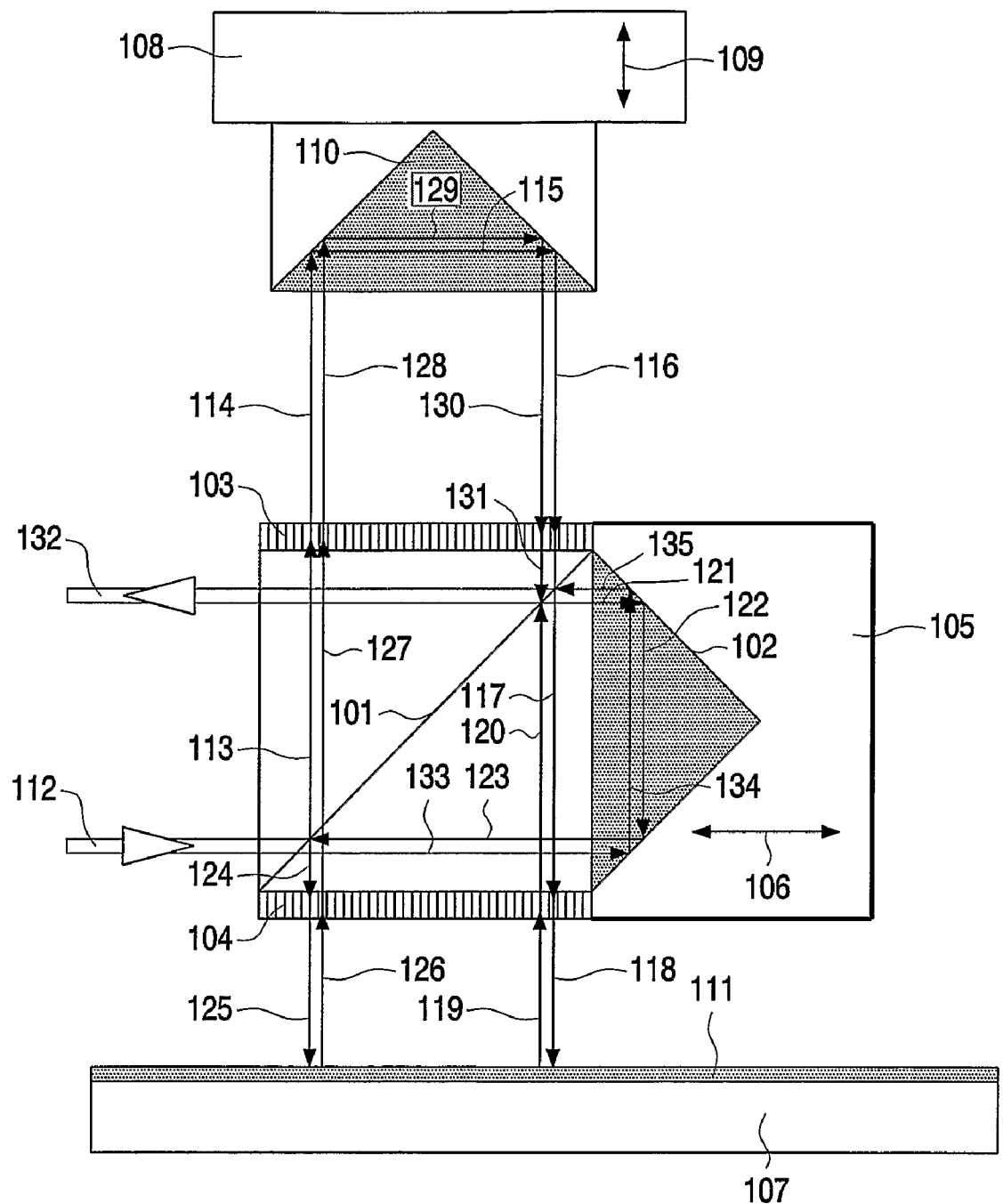
FIG. 5 shows an alternative laser interferometer for measuring a distance.

FIG. 5 shows a laser interferometer similar to the interferometer shown in FIG. 1, however one of the two retro-reflectors is not a plane mirror reflector, but a corner cube reflector 110. The advantage of the cube corner reflector is its insensitivity for its angular position. In case the chuck is provided with a cube corner reflector in stead of a plane mirror reflector, the measurement is less sensitive for variations in the angular position of the chuck, because the reflected laser beam of the cube corner reflector is always parallel with the incident laser beam.

The laser interferometer shown in FIG. 5 comprises a laser beam splitter 101, a cube corner reflector 102 and two quarter wave plates 103,104. These components of the laser interferometer are attached to the intermediate stage 105 of a system for positioning of a product. The intermediate stage 105 can move in the second direction Y, as is indicated with arrow 106. The laser interferometer is located between a stationary base 107 and a chuck 108, to which the product to be positioned can be attached. The chuck 108 can move in the first direction X with respect to the intermediate stage 105, as is indicated with arrow 109. A corned cube reflector 110 is attached to the chuck 108 and an elongated plane mirror reflector 111 is attached to the stationary base 107.

The distance between the stationary base 107 and the chuck 108 can be measured by means of the laser interferometer as follows. A polarized laser beam 112, comprising two polarization directions perpendicular to each other is directed to the represented parts of the interferometer. A first part of the laser beam 112 follows a path including four times the distance between the retro-reflectors 110,111, and the other part of the laser beam 112 follows a fixed path through the laser interferometer. The distance between the two retro-reflectors 110,111, and position of the chuck 108 in the first direction X relative to the stationary base 107, can be determined based on the difference in lengths of said two paths followed by the two parts of the laser beam 112.

In the beam splitter 101, the first part of the incident laser beam 112 is turned off by an angle of 90° (arrow 113) to and through quarter wave plate 103 towards the cube corner reflector 110 (arrow 114). The laser beam passes the cube corner reflector 110 (arrow 115) and is reflected (arrow 116) towards the quarter wave plate 103. After passing the quarter wave plate 103, the direction of the polarization of the laser beam (arrow 117) is rotated over 90° (two times 45°) compared to the laser beam indicated with arrow 113. Therefore the laser beam (arrow 117) can pass the beam splitter 101 in a straight path towards quarter wave plate 104, where the direction of polarization rotates over 45°. Then the laser beam (arrow 118) reflects against the plane mirror reflector 111 and returns at the quarter wave plate 104 (arrow 119), where the direction of polarization rotates again over 45°, so that the beam (arrow 120) is rotated over 90° compared to the beam indicated with arrow 117. Therefore the beam (arrow 120) is turned off by an angle of 90° by the laser beam splitter 101 (arrow 121) in the direction of the cube corner reflector 102.

In the cube corner reflector 102 the beam 121 is reflected (arrow 122) in order to leave the reflector 102 (arrow 123) in reverse direction parallel to and at a distance from the incident beam 121. The reflected beam 123 is turned off by an angle of 90° (arrow 124) by the beam splitter 101 in the direction of quarter wave plate 104. When passing quarter wave plate 104 the direction of the polarization of the laser beam is rotated over 45°. The beam (arrow 125) then arrives at the plane mirror reflector 111, and is reflected (arrow 126) to the quarter wave plate 104 where the direction of polarization again rotates over 45°, so that the beam (arrow 127) passes beam splitter 101 in a straight path. After passing quarter wave plate 103 the beam (arrow 128) is reflected in the cube corner reflector 110 (arrows 129 and 130) and arrives at quarter wave plate 103, where the direction of polarization is again rotated over 45°, so that the total rotation compared to the beam indicated by arrow 127 is 90°. Therefore, the beam (arrow 131) is turned off by an angle of 90° by the beam splitter 101, whereby the beam is combined again with said other part of the original laser beam 112 to form the laser beam 132 that leaves the relevant part of the interferometer.

The other part of the laser beam 112 has a direction of polarization that can pass the laser beam splitter 101 in a straight path (arrow 133), and after reflection by cube corner 102 (arrow 134) the other part of the laser beam is directed again towards the beam splitter 101 (arrow 135). The laser beam (arrow 135) passes again the beam splitter 101 in a straight path, so that it forms a part of the laser beam 132 that leaves the relevant part of the laser interferometer.

As said above referring to FIG. 1, the part of the laser interferometer that measures the difference in length of the two paths that is followed by the two parts of the laser beam is not represented in the figure. That part is located at a fixed position relative to the stationary base 107, so that the distance between that part and the main part of the interferometer that is attached to the intermediate stage 105 varies. However, such variation does not have influence on the difference in length of said two paths, and therefore it has no influence on the measurement results.

The embodiments as described above are merely examples of the system for positioning a product by means of a laser interferometer; a great many other embodiments are possible.

REFERENCE NUMBERS 1 laser beam splitter (=schuin staande 'spiegel')
2 cube corner reflector
3 quarter wave plate
4 quarter wave plate
5 intermediate stage
6 arrow
7 stationary base
8 chuck
9 arrow
10 plane mirror reflector
11 plane mirror reflector
12 laser beam
13-29 arrows
30 laser beam
31-33 arrows
34-40 ...
41 stationary base
42 intermediate stage
43 arrow
44 chuck
45 arrow
46 distance
47 main part of interferometer
48 laser beam
49 plane mirror reflector
50 plane mirror reflector
51-55 laser beams (4×)
56-60 ...
61 stationary base
62 intermediate stage
63 arrow
64 chuck
65 arrow
66 plane mirror reflector
67 plane mirror reflector
68 main part of interferometer
69 laser beam
70 laser beam
71 chuck
72 stationary base 73-78 laser interferometers
79 intermediate stage
80-81 arrows
82-85 plane mirror reflectors
86 laser beams (3×)
87 plane mirror reflector
88-89 laser beams
90 mirror
91 plane mirror reflector
92 arrow
93 laser beam
94-100 . . .
101 beam splitter
102 cube corner reflector
103-104 quarter wave plates
105 intermediate stage
106 arrow
107 stationary base
108 chuck
109 arrow
110 cube corner reflector
111 plane mirror reflector
112 laser beam
113-131 arrows
132 laser beam
133-135 arrows

The invention claimed is:

1. A system for positioning a product, comprising a chuck for supporting the product, an intermediate stage supporting said chuck, and a stationary base supporting said intermediate stage, whereby the chuck can move with respect to the intermediate stage in a first direction X, and the intermediate stage can move with respect to said stationary base in a second direction Y, furthermore comprising at least a first and a second laser interferometer for measuring the position of the chuck relative to the stationary base, a first and a second main part of said respective first and second laser interferometers including optical components for receiving and directing a first and a second laser respectively, the first and second main parts being attached to said intermediate stage and being movable therewith for measuring respectively the distance between a first elongated plane mirror reflector on the chuck that is elongated in the first direction X and an elongated plane mirror reflector on the stationary base that is elongated in the second direction Y, and the distance between a second elongated plane mirror reflector on the chuck that is elongated in the first direction X and the elongated plane mirror reflector on the stationary base.

2. A system as claimed in claim 1, the elongated plane mirror reflector on the stationary base having a length larger than the maximal displacement of the intermediate stage in said second direction Y.

3. A system as claimed in claim 1, further comprising a third laser interferometer having a main part that is attached to said stationary base, the main part including optical components for receiving and directing a third laser for measuring the distance between a third elongated reflector on the chuck that is elongated in the first direction X and the main part on the stationary base.

4. A system as claimed in claim 1, further comprising three laser interferometers each having a main part, the respective main parts of the three laser interferometers are attached to said intermediate stage and movable therewith, for measuring distances in the first direction X between one or more first reflectors on the chuck and one or more plane mirror reflectors in the stationary base.

5. A system as claimed in claim 1, the chuck further comprising a cube corner reflector.

6. A system as claimed in claim 1, wherein the first and second main parts are attached to said intermediate stage for measuring respectively the distance in the third direction Z between the first elongated plane mirror reflector on the chuck and the elongated plane mirror reflector on the stationary base, and the distance in the third direction Z between the second elongated plane mirror reflector on the chuck and the elongated plane mirror reflector on the stationary base, which third direction Z is perpendicular to the first direction X and the second direction Y.

7. A method for positioning a product by means of a system comprising a chuck for supporting the product, an intermediate stage supporting said chuck, and a stationary base supporting said intermediate stage, whereby the chuck can move with respect to the intermediate stage in a first direction X, and the intermediate stage can move with respect to said stationary base in a second direction Y, the method comprising attaching at least a first and a second laser interferometer to the intermediate stage, the first and second laser interferometers respectively further comprising a first and a second main part including optical components for receiving and directing a first and a second laser, the first and second main parts being movable with the intermediate stage, and measuring the position of the chuck relative to the stationary base by measuring a first distance between a first elongated reflector on the chuck and an elongated reflector on the stationary base using the first laser interferometer, and a second distance between a second elongated reflector on the chuck and the elongated reflector on the stationary base using the second laser interferometer.

8. A method as claimed in claim 7, wherein the first and second elongated reflectors on the chuck are elongated in the first direction X and the elongated reflector on the stationary base is elongated in the second direction Y.

9. A method as claimed in claim 7, further comprising moving the chuck relative to the stationary base and measuring the position of the chuck relative to the stationary base during such movement.

* * * * *